(12) United States Patent
Jacobson et al.

(10) Patent No.: US 7,546,394 B1
(45) Date of Patent: Jun. 9, 2009

(54) MANAGEMENT OF CONFIGURATION DATA BY GENERATING A CHAIN DESCRIPTION DATA SET THAT SPECIFIES AN ORDER OF CONFIGURATION CHAIN FOR MULTI-DEVICE SYSTEMS

(75) Inventors: Neil G. Jacobson, Los Altos, CA (US); Emigdio M. Flores, Jr., Coral Springs, FL (US); Sanjay Srivastava, San Jose, CA (US); Bin Dai, Mountain View, CA (US); Sungnien Jerry Mao, Fremont, CA (US); Rosa M. Y. Chow, Redwood City, CA (US); Pushpasheel Tawade, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 1056 days.

(21) Appl. No.: 10/805,114

(22) Filed: Mar. 19, 2004

(51) Int. Cl.
 *G06F 13/00* (2006.01)
(52) U.S. Cl. .................. 710/23; 710/8; 710/9; 710/10; 710/34; 716/16; 716/17; 716/18
(58) Field of Classification Search .............. 710/8–10, 710/23, 34; 716/16–18
See application file for complete search history.

(56) References Cited

U.S. PATENT DOCUMENTS

| | | | |
|---|---|---|---|
| 5,079,725 A | 1/1992 | Greer et al. | |
| 5,319,598 A * | 6/1994 | Aralis et al. | ........... 365/189.12 |
| 5,635,855 A | 6/1997 | Tang | |
| 5,748,980 A | 5/1998 | Lipe et al. | |
| 5,794,066 A | 8/1998 | Dreyer et al. | |
| 5,841,867 A | 11/1998 | Jacobson et al. | |
| 6,065,113 A | 5/2000 | Shiell et al. | |
| 6,299,820 B1 * | 10/2001 | Weinstein | .................. 264/513 |
| 6,336,209 B1 * | 1/2002 | Nishihara et al. | ............. 716/17 |
| 6,381,509 B1 | 4/2002 | Thiel et al. | |
| 6,922,820 B1 | 7/2005 | Lulla et al. | |
| 6,948,147 B1 * | 9/2005 | New et al. | ..................... 716/16 |
| 7,065,692 B2 | 6/2006 | Whetsel | |
| 7,117,414 B2 | 10/2006 | Hartmann | |

OTHER PUBLICATIONS

U.S. Appl. No. 10/805,113, filed Mar. 19, 2004, Jacobson et al.
IBM, Using a Portion of the Boundary Register as the Identification Register, Sep. 1, 1989, vol. 32, Issue 4A, pp. 262-264.

* cited by examiner

*Primary Examiner*—Tammara Peyton
(74) *Attorney, Agent, or Firm*—LeRoy D. Maunu; Justin Liu

(57) ABSTRACT

Methods and apparatus are disclosed for managing configuration data for a system. In various embodiments, a chain description data set is generated to specify an order in a configuration chain of configurable devices in the system and identify configuration data sets associated with the configurable devices. A system identifier value is generated and associated with the chain description data set. An archive is generated including the configuration data sets, chain description data set, and system identifier value.

23 Claims, 7 Drawing Sheets

US 7,546,394 B1

MANAGEMENT OF CONFIGURATION DATA BY GENERATING A CHAIN DESCRIPTION DATA SET THAT SPECIFIES AN ORDER OF CONFIGURATION CHAIN FOR MULTI-DEVICE SYSTEMS

FIELD OF THE INVENTION

The present invention generally relates to managing configuration data for systems having a plurality of configurable devices.

BACKGROUND

Some systems contain many devices that are configurable. One type of configurable device is a programmable logic device (PLD). Examples of programmable logic devices include field programmable gate arrays (FPGAs), complex programmable logic devices (CPLDs), programmable array logic (PAL), and programmable logic arrays (PLAs). As systems are developed with increasing numbers of configurable devices, management of the configuration data for these devices becomes increasingly problematic. Challenges may arise from having different design teams involved in developing the configuration data for a system, as well as from different versions of configuration data created for custom applications and different releases created to improve the system or fix problems.

For a complex system, different design teams may be responsible for developing the design for different functional areas of the system. In some instances, the design teams may be using different servers for data storage, and the directory structure used in managing the configuration data may vary by design team. Thus, the configuration data for a system may be spread across numerous storage domains and not uniformly organized.

Different versions of configuration data generated during the product development cycle and maintenance activities also complicate management of configuration data. One or more devices in a system may have different configuration data from one release to the next. Each new release adds to the number of configuration data files to be managed. Thus, there may be numerous files of configuration data to deal with for a single system.

For maintenance activities, identifying the correct configuration data for a system may also be problematic. In systems made with programmable logic devices (PLDs), such as field programmable gate arrays (FPGAs) or complex programmable logic devices (CPLDs), the same physical hardware components may take on different personalities based on the configuration. Thus, one system may appear to be physically the same as another system, but the configuration of the systems may make them slightly or even very different from one another. Identifying a system and then selecting the correct configuration data may present various challenges to technicians and users.

The present invention may address one or more of the above issues.

SUMMARY OF THE INVENTION

The various embodiments of the invention relate to managing configuration data for a system. In one embodiment, a chain description data set is generated to specify an order in a configuration chain of configurable devices in the system and identify configuration data sets associated with the configurable devices. A system identifier value may be generated and associated with the chain description data set. An archive may be generated including the configuration data sets, chain description data set, and system identifier value.

In other embodiments, the stored system identifier value may be used to verify whether the archived configuration data is suitable for a target system. Still other embodiments preserve a directory hierarchy of configuration data files in the archive for portability and ease of restoration.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

The various embodiments of the invention assist in particularly identifying electronic systems. In one embodiment, identifier codes are read from the electronic devices that comprise the system. The system identifier is determined based on the values of all the identifier codes read from the system. Depending on implementation requirements, a device may be manufactured with a fixed identifier code, a user may configure the device with a user-specific identifier code, the identifier code may be determined from pin states of the device, or various combinations of these approaches may be used to identify a system.

In various other embodiments, the configuration data associated with an electronic system may be managed in association with the system's unique identifier. Archiving configuration data files in a selected directory structure and associating the system identifier with the archive enables portability of the configuration data and reduces the chances of improperly configuring a system.

Figure 1:
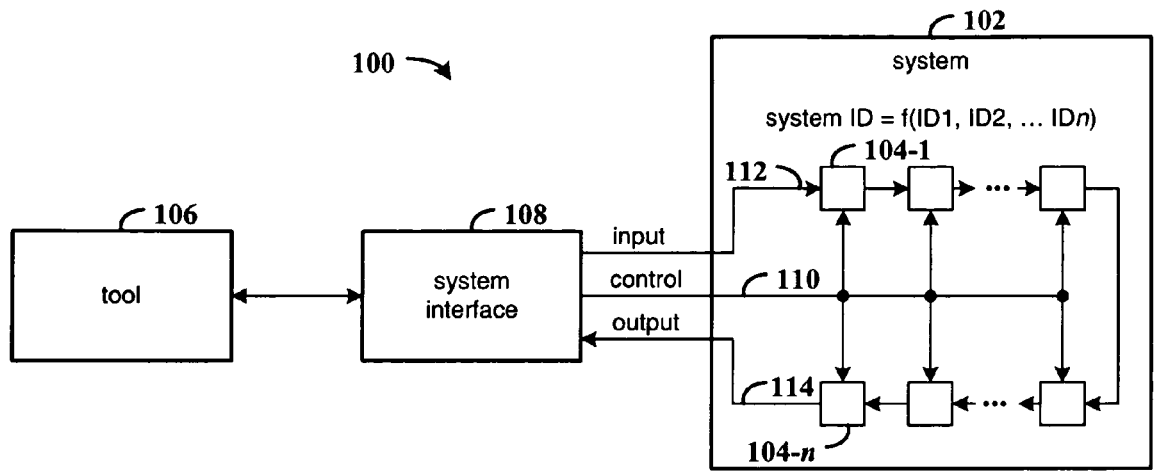
FIG. 1 is a block diagram of an arrangement for identifying an electronic system that includes a plurality of electronic devices.

FIG. 1 is a block diagram of an arrangement 100 for identifying an electronic system 102 that includes a plurality of electronic devices 104-1-104-*n*. In an example environment, a software tool 106 may be used to learn the identity of an electronic system 102. The tool is coupled to the system via system interface 108, which may include the software drivers and hardware interface needed to communicate with the devices 104-1-104-*n*.

The general functions provided by tool 106 may support testing, configuration, or even application functions directed to end users of the system. The ability to obtain the identity of a system may be useful for activities such as verifying compatibility between the tool and the system, verifying license rights, or learning a release level of the system. It will be appreciated that various commercially available or proprietary tools and system interfaces may be adapted for use with the embodiments of the present invention.

In various embodiments, the system identifier may be generated from selected device-identifying signals read from all the devices in the system. That is, the collection of signals read from all the devices may be used to derive a system identifier code. Alternatively, the system identifier code may be generated from a selected subset (fewer than all) of the devices in the system. For example, the identifier may be generated from each odd or even numbered device in a scan chain. Different combinations of devices may be used to identify the system according to implementation requirements.

In one embodiment, the boundary-scan architecture defined in IEEE standard 1149.1 may be used to support identifying an electronic system. It will be understood that "JTAG" is sometimes used to refer to the 1149.1 standard and similar boundary-scan standards. With JTAG, each of devices 104-1-104-*n* has a boundary-scan register into which scan data is serially input to the device or output from the device. The devices are connected in a scan chain with the scan output pin (TDO) of one device feeding the scan input pin (TDI) of the next device in the chain. The system interface 108 is coupled to each of the devices 104-1-104-*n* with control lines 110 (e.g., TMS, TCK) for controlling the input and output of scan data to the devices. Lines 112 and 114 illustrate the serial input and serial output data lines. In some embodiments, a memory, for example a non-volatile memory, may be coupled to the device and store an identifier for the device. In such embodiments, the stored identifier may also be used to derive the system identifier code.

It will be appreciated that other types of interfaces, standard or proprietary, may be used to implement an interface to electronic devices for learning device identification codes.

Figure 2:
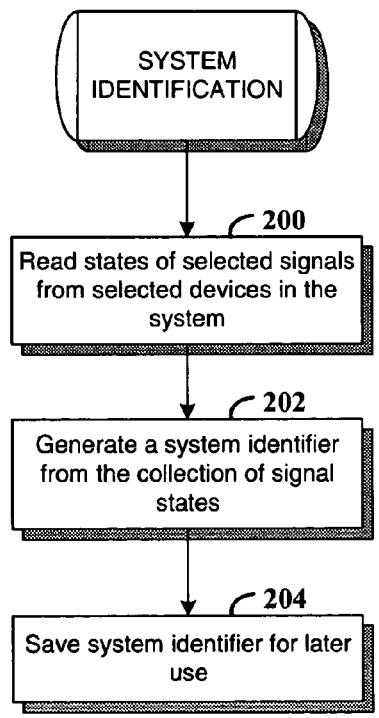
FIG. 2 is a flowchart of an example process for identifying an electronic system in accordance with various embodiments of the invention.

FIG. 2 is a flowchart of an example process for identifying an electronic system in accordance with various embodiments of the invention. The states of selected signals are read from selected devices of the system (step 200). The selected signals are those signals chosen to identify the device according to implementation requirements. As previously explained, different implementations may use all of the devices on the system or various subsets of devices of the system for learning the system identifier code.

The particular signals that are read from a device to learn a device identification code may vary from implementation to implementation. It will be appreciated that the approaches to learning device identifier codes described herein may be used alone or in various combinations to meet implementation objectives.

Figure 3A:
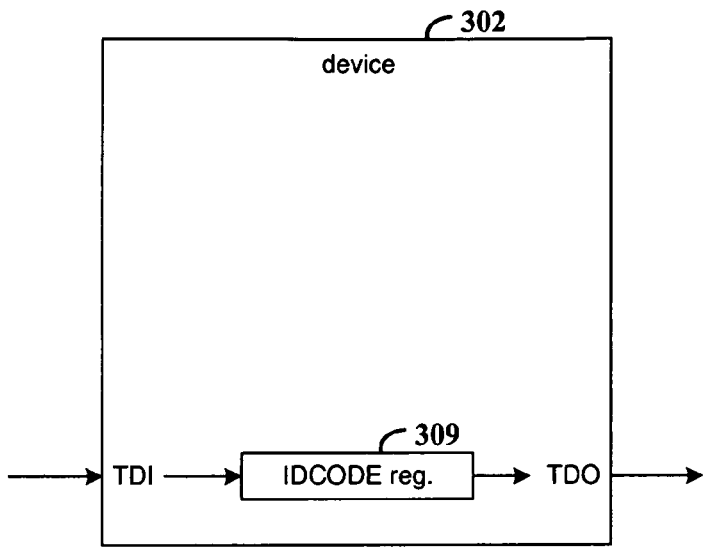
FIGS. 3A, 3B, 3C, and 3D illustrate example embodiments of electronic devices from which a system identification code may be determined.

In one approach, the contents of the boundary-scan IDCODE register may be used to identify a device (see FIG. 3A). The contents of the IDCODE register are generally set by the device manufacturer and specify information such as the identification code and revision number for the device. In some embodiments, the IDCODE register is non-programmable, or has limited programmability (e.g., a one-time programmable fuse).

Figure 3B:
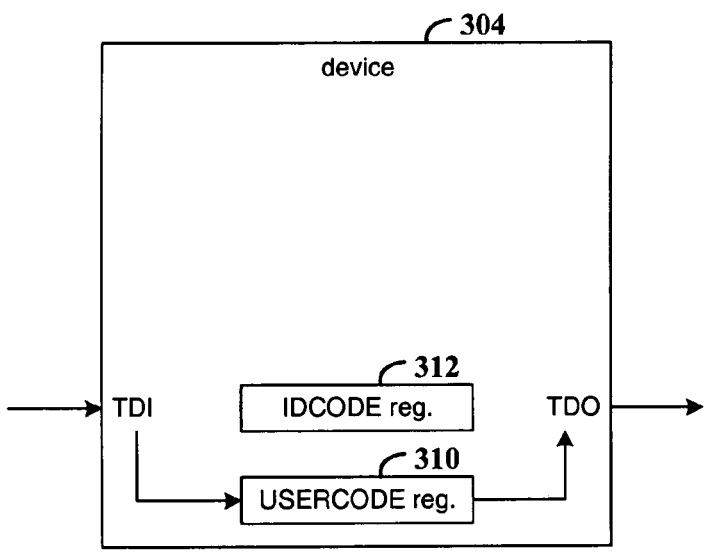

In another approach, because the IDCODE register may not be specific enough to identify a system for some implementations, the boundary-scan USERCODE register may be used either alone or in combination with the IDCODE register to more particularly identify a device and thereby a system (see FIG. 3B). The USERCODE register is programmable via the boundary-scan TDI interface, which allows a device to be particularly identified according to user requirements. It will be appreciated that the "user" may be, for example, the system vendor, system maintainer, or end user. Examples of values that may be stored in the USERCODE register include a checksum of configuration data from a PLD or a value derived from the configuration data and the position of the device on the scan chain.

Figure 3C:
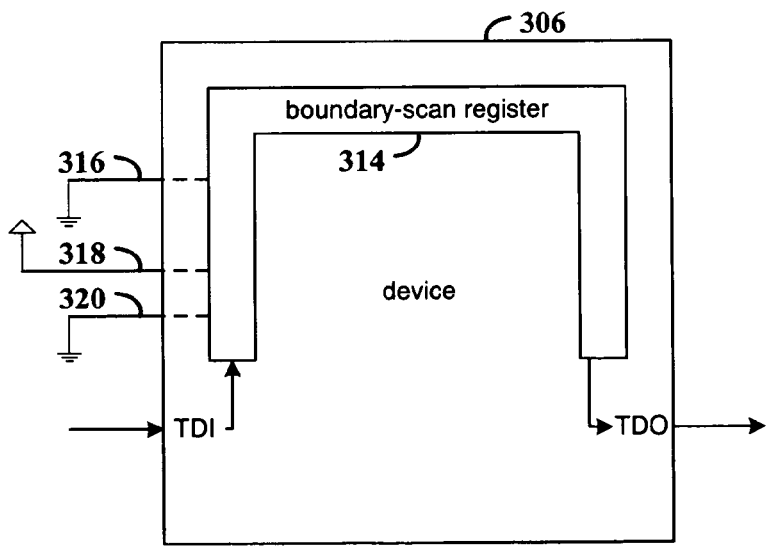

In another approach, the boundary-scan register (BSR) may be used to determine the identity of a device (see FIG. 3C). In particular, the boundary-scan EXTEST and SAMPLE (or SAMPLE/PRELOAD) instructions may be used to access the boundary-scan register. The EXTEST instruction causes the TDI and TDO pins to be connected to the boundary-scan register. The pin states of the device may be sampled and new values shifted into the boundary-scan register. Then, the new values may be applied to the pins of the device.

The SAMPLE instruction also causes the TDI and TDO pins to be connected to the BSR. However, the device is left in its normal functional mode. During this instruction, the boundary-scan register may be accessed by a data scan operation to sample the functional data input to and output from the device. The SAMPLE instruction may also be used to load data into the boundary-scan register prior to loading an EXTEST instruction.

Figure 4:
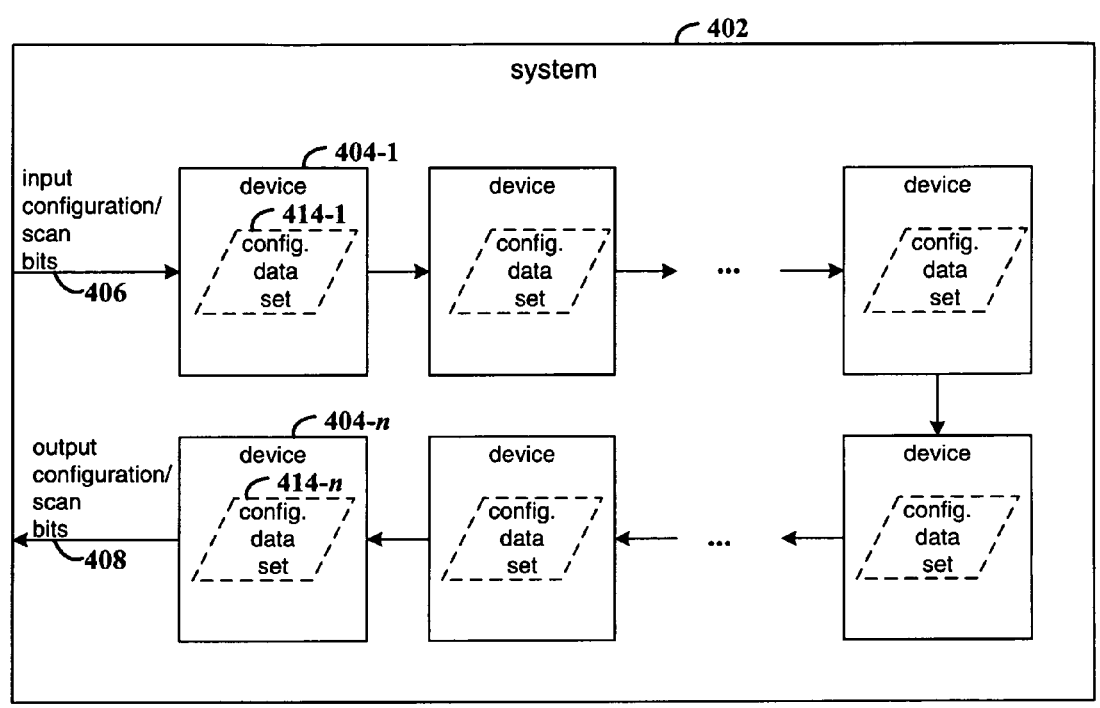
FIG. 4 illustrates an electronic system in which configuration data from each of the devices in the system may be used to identify the system.

In another approach, the configuration data in a programmable logic device may be used to identify the device (see FIG. 4). The configuration data from a device may be read back and a checksum value computed from the configuration data. The checksum value identifies the device and may be used in combination with the checksum values from other devices to particularly identify the system.

The system identifier code is generated from the device identifier codes (step 202). There may be many suitable functions for generating a system identifier code from a set of device identifier codes. For example, in one implementation, a concatenation of the device identifier codes may be used as the system identifier code. In another implementation, a combination of the positions of the devices in the scan chain along with the device identifier codes may be used to generate a system identifier code. It will be appreciated that various other transformations of the device identifier codes, and position if desired, may be alternatively used.

The system identifier code may then be saved for subsequent use (step 204). For example, the system identifier code may be useful for licensing authorization, confirming an upgrade level, or identifying system capabilities.

In another embodiment, the identification code may be stored in a non-volatile memory and later used to detect unauthorized reconfiguration of the system. For example, a controller may periodically read device identifier codes and generate a new system identifier code, and then compare the new system identifier code to the stored code. If the new system identifier code does not match the stored system identifier code, the system may be halted or an electronic message may be sent to a party interested in the mismatch.

FIGS. 3A, 3B, 3C, and 3D illustrate example embodiments of electronic devices 302, 304, 306, and 308, respectively, from which a system identification code may be determined. Each of the example devices is implemented with logic that complies with the boundary-scan architecture.

FIG. 3A illustrates a device 302 in which the IDCODE register 309 is connected to the TDI and TDO pins of the device 302. The connection is made in response to input of an IDCODE instruction to the boundary-scan logic (not shown), and the register's contents are shifted out on the TDO pin.

FIG. 3B illustrates a device 304 in which the USERCODE register 310 may be used alone or in combination with the IDCODE register 312. The USERCODE register 310 is connected to the TDI and TDO pins in response to input of a USERCODE instruction to the boundary-scan logic, and the register's contents are shifted out on the TDO pin.

FIG. 3C illustrates a device 306 in which the boundary-scan register 314 is connected to the TDI and TDO pins. The boundary-scan SAMPLE instruction may be used to obtain the states of device pins in the boundary-scan register and shift out the contents via the TDO pin. In using the SAMPLE instruction, the device is left in its normal functional mode. The boundary-scan register can be accessed by a data scan operation to take a sample of the functional data entering and leaving the device while selected pins of the device are held at a selected signal levels, as illustrated by signal lines 316, 318, and 320. Thus, by setting the values at signal lines 316, 318, and 320 appropriately, the device may be identified.

Figure 3D:
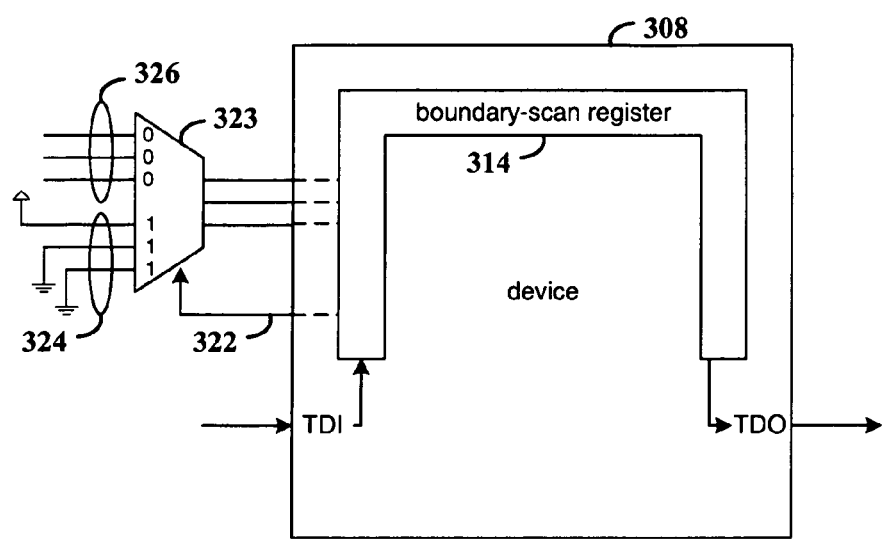

FIG. 3D illustrates a device 308 in which the boundary-scan register 314 is connected to the TDI and TDO pins, and a boundary-scan EXTEST instruction may be used to obtain a fixed value from the boundary-scan register. An output pin of device 308 is driven to logic level 1 and provided on line 322 to a multiplexer 323 to perform system identification. When the signal on line 322 is logic level 1 the multiplexer selects the identification signals on lines 324, and when the signal is logic level 0 the multiplexer selects the normal input signals on lines 326. The signals on lines 324 are held at a selected signal levels to perform the system identification. The multiplexer or equivalent functionality may be implemented external to the device or possibly as part of the internal device logic.

FIG. 4 illustrates an electronic system 402 in which configuration data from each of the devices 404-1-404-*n* in the system may be used to identify the system. Certain PLDs, such as various FPGAs from Xilinx, Inc., may be connected in serial for loading and reading back configuration data. The devices have pins for input of configuration bits. For example an input pin of device 404-1 is connected to line 406. Similarly, the devices have output pins for output of configuration bits. For example, a configuration output pin of device 404-*n* is connected to line 408. The configuration bits and boundary-scan bits may use the same pins for input of data, as illustrated. In other implementations, the configuration bits and scan bits may be input on separate pins.

Each of devices 404-1-404-*n* is configured with a respective configuration data set 414-1-414-*n*. Each configuration data set programs the associated device to implement desired functionality. These same configuration data sets may be read back from the devices (using conventional tools) and collectively used to generate a system identifier code by which the system 402 may be particularly identified, as explained above.

The identification of an electronic system may be used in managing configuration data for a system that includes multiple programmable logic devices, such as shown in FIG. 4. In a system having multiple PLDS, the number of configuration data sets to be managed grows with each system revision or update. The number of configuration data sets to be managed may be compounded in situations where configuration data sets must be managed for multiple systems.

Figure 5A:
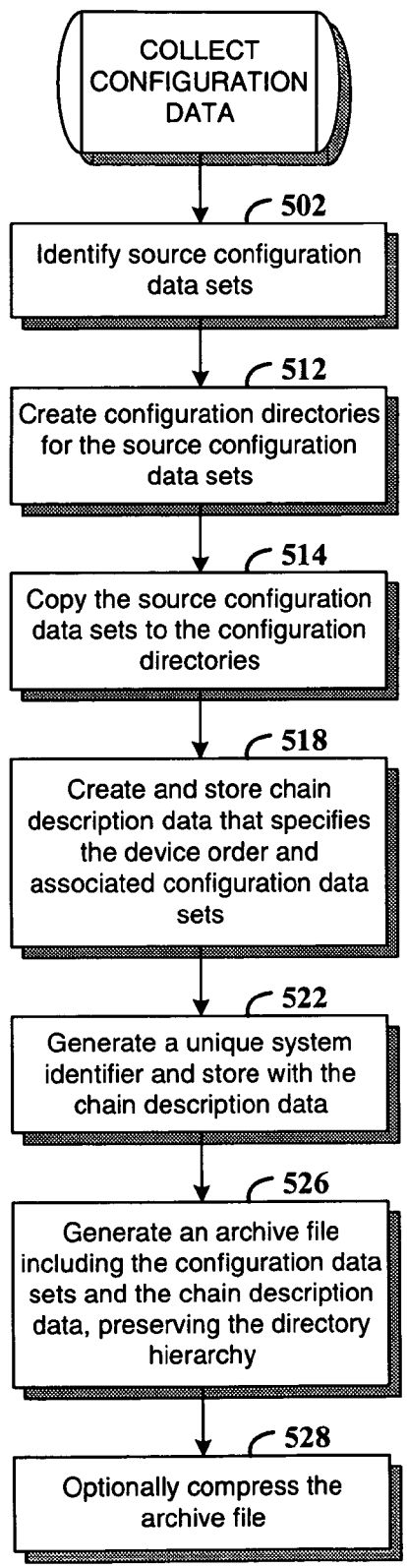
FIG. 5A illustrates an example process for collecting the configuration data associated with configuring an electronic system having a plurality of programmable logic devices in accordance with various embodiments of the invention.
Figure 5B:
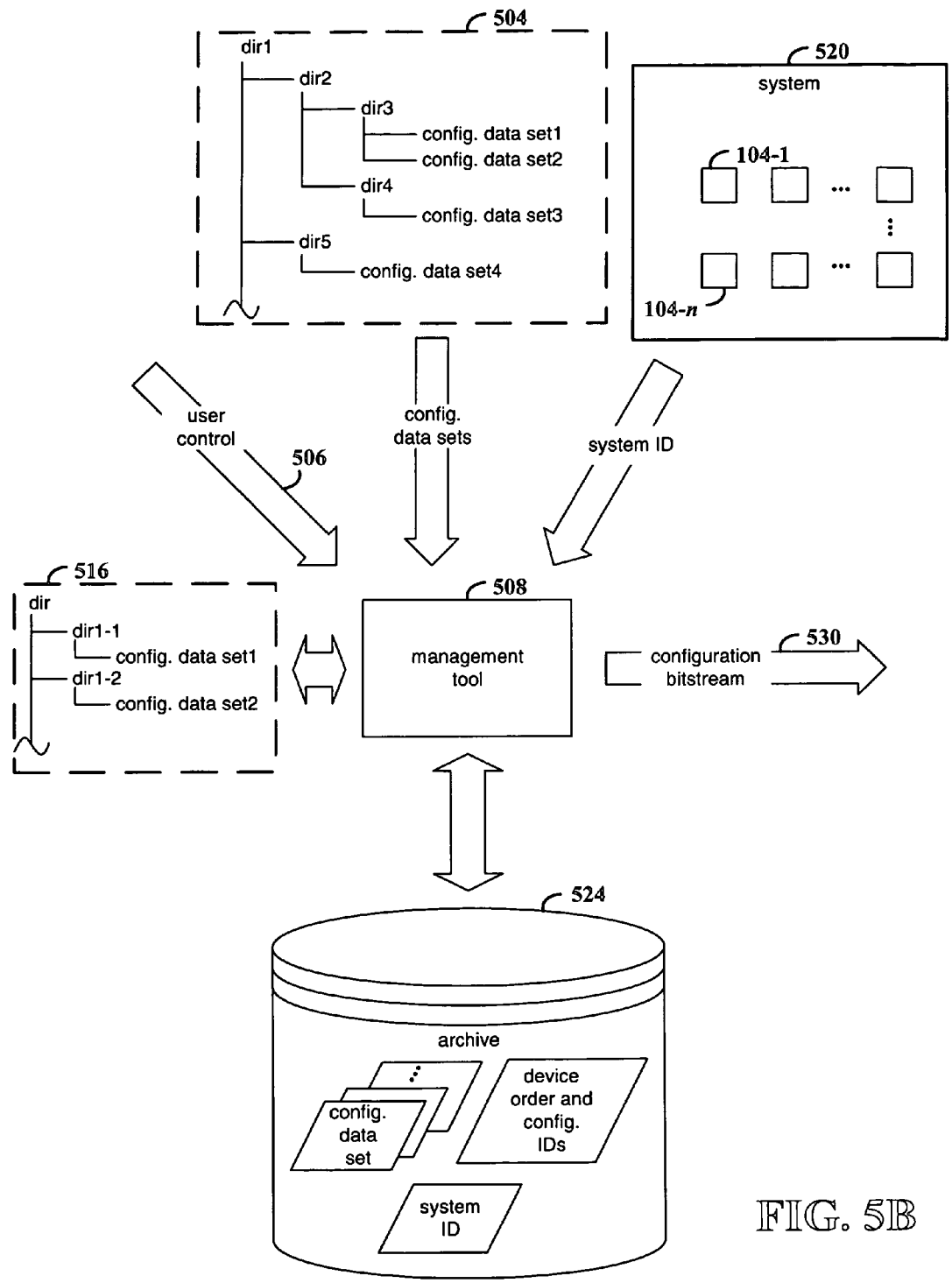
FIG. 5B is a data flow diagram that illustrates an example arrangement of configuration data sets assembled in an archive in accordance with various embodiments of the invention.

FIG. 5A illustrates an example process for collecting the configuration data associated with configuring an electronic system having a plurality of programmable logic devices in accordance with various embodiments of the invention. FIG. 5B is a data flow diagram that illustrates an example arrangement of configuration data sets assembled in an archive in accordance with various embodiments of the invention. Various elements of FIG. 5B, as well as elements in FIG. 4, may be referenced in describing the process flow of FIG. 5A.

The process may commence with identifying the configuration data sets required for configuration of a system (step 502). For example, each of configuration data sets 414-1-414-*n*, may be stored in a networked or local file system 504 (FIG. 5B), and organized in a hierarchical directory structure. For example in file system 504 (FIG. 5B), configuration data set1 and set2 are stored in directory dir3, which is a subdirectory of dir2, which is a subdirectory of dir1. Identifying the configuration data sets may involve a user specifying (user control 506) to a management tool 508 the names of the files in which the configuration data sets are stored and the directory paths to the files. Alternatively, one or more databases may be used to store the configuration data sets, and part of the identification may involve specifying keys associated with the configuration data sets.

In one embodiment, a separate directory structure may be created containing unique configuration directories for each of the configuration data sets (step 512). The separate directories are created to avoid having to change the name of a file of configuration which might be the same as the name of another file of configuration data. Each file of configuration data is then copied to the configuration directory created for that file (step 514). The separate directory structure is illustrated by block 516 (FIG. 5B).

The process also creates and stores data that is later used to generate a configuration bitstream for the system (step 518). Configuration bitstream refers to the correctly ordered stream of data that is input to the system for configuration of the various configurable devices. For example, the configuration bitstream for system 402 (FIG. 4) includes the configuration data sets 414-1-414-*n* in the proper order for shifting the configuration data sets into the respective devices. Chain description data specifies information relating to the various configurable devices, such as the device order in the scan chain and the configuration data set (or "file") associated with each device. In an example embodiment, a user may specify to the management tool 508 the device order and configuration data sets associated with the devices. In an alternative embodiment, the management tool 508 may read device identifier codes from the system 520 for determining the order of devices and require the user to match the device identifiers to the proper configuration data sets.

A system identifier code is generated and stored with the chain description data (step 522). The system identifier code may be generated as described in the discussion of FIGS. 1-4.

An archive file 524 (FIG. 5B) is created using the new directory structure of configuration data 516 (FIG. 5B), the chain description data, and the system identifier code (step 526). In archiving the configuration data sets, the new directory structure 516 is preserved in the archive so that when the data is extracted, the files are extracted into the same new directory structure and the configuration bitstream 530 (FIG. 5B) may be easily assembled. The archive file may be created using known operating system utilities. Archiving the configuration data sets and associated information allows the complete data set for configuration a system to be easily moved from one site or system to another.

The archive file may be optionally compressed (step 528). For example, if the archive is a Zip file the data is automatically compressed. For other types of archives, additional utilities may be used for compressing the data. The archive file may also be optionally encrypted for additional data security. When encryption is used, the data will be decrypted only when an appropriate matching decryption key is provided.

Figure 6:
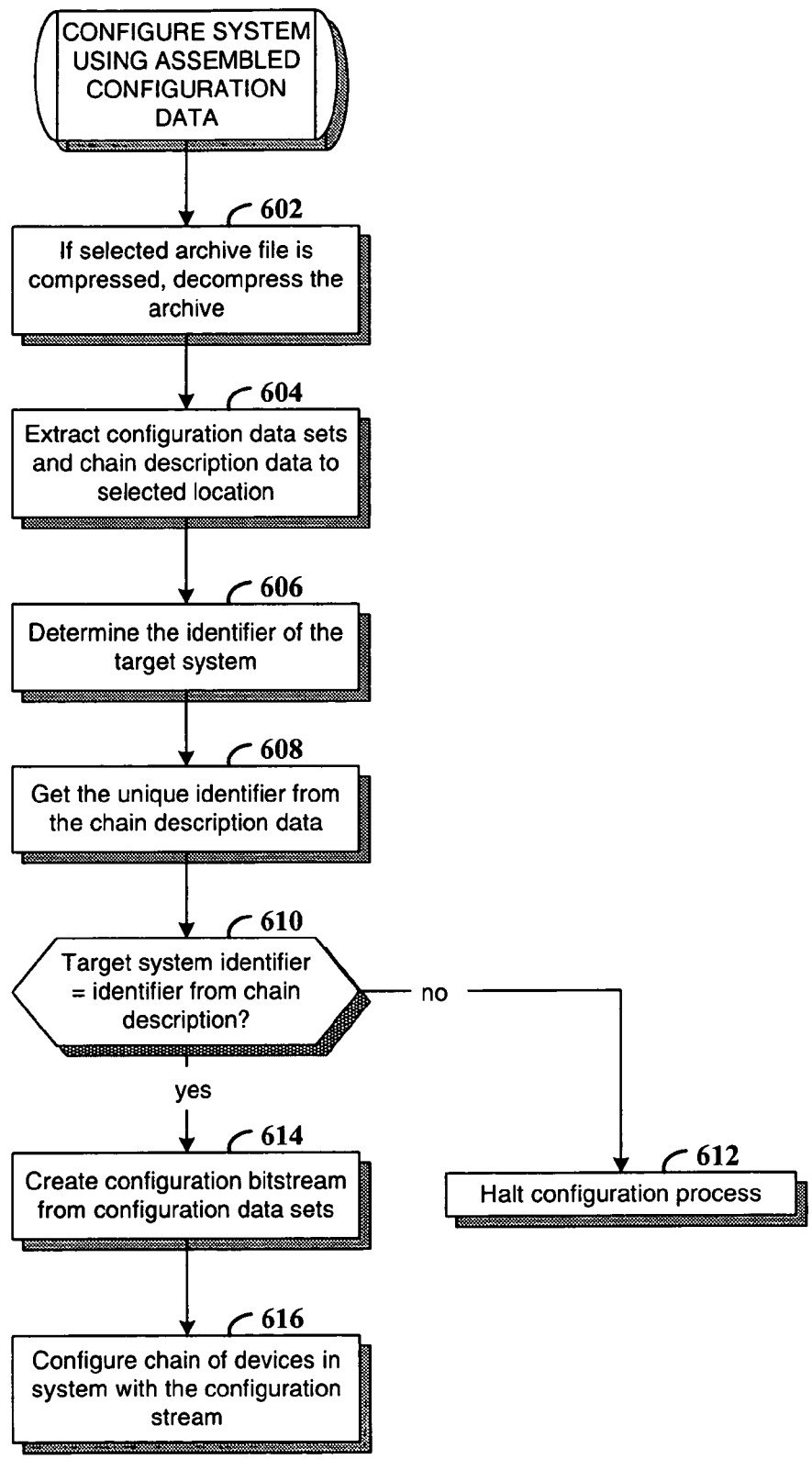
FIG. 6 is a flowchart of an example process for configuring an electronic system using configuration data collected in accordance with various embodiments of the invention.

FIG. 6 is a flowchart of an example process for configuring an electronic system using configuration data collected in accordance with various embodiments of the invention. The process of FIG. 6 assumes that the configuration data has been collected using the process of FIG. 5A. The configuration process may be implemented as functions provided by management tool 508 (FIG. 5B).

If the archive file selected for use in configuring a system is compressed, the archive is decompressed (step 602). The data in the archive is extracted (step 604). As indicated above, the directory structure of the files of configuration data is preserved in extracting the files from the archive so that the files used to construct the configuration bitstream may be easily located. The location to which the data is extracted may be selected by the user.

The process then determines the identifier of the target system (step 606). The target system is the electronic system being considered for configuration with the data from the archive. The target system identifier may be determined using the approaches described in the discussion of FIGS. 1-4.

The system identifier extracted from the archive is read (step 608) and compared to the target system identifier (decision step 610). If the identifiers are not equal, the configuration process is halted (step 612). The mismatch of identifiers indicates that the extracted configuration data is inappropriate for the target system. This may save the user from unknowingly creating problems.

If the identifiers match, a configuration bitstream is created from the extracted files of configuration data sets (step 614). The extracted chain description data is used to appropriately order the configuration data sets in the configuration bitstream. Once the configuration bitstream is assembled, the chain of devices in the system may be configured (step 616).

It is also possible to use this mechanism when applying upgrades to systems. In this scenario, the target system is already configured. The upgrade might only be applied if the system identification value of the target system as currently configured is in an allowed list for the upgrade. This prevents upgrades that may be incompatible with the existing system from being applied.

Those skilled in the art will appreciate that various alternative computing arrangements would be suitable for hosting the processes of the different embodiments of the present invention. In addition, the processes may be provided via a variety of computer-readable media or delivery channels such as magnetic or optical disks or tapes, electronic storage devices, or as application services over a network.

The present invention is believed to be applicable to a variety of systems for managing configuration data for electronic systems and has been found to be particularly applicable and beneficial in uniquely identifying electronic systems from the collection of device identifiers and associating unique system identifiers with the configuration data of the system. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for managing configuration data for a system, comprising:
    generating a chain description data set that specifies an order in a configuration chain of configurable devices in the system and identifies configuration data sets associated with the configurable devices;
    generating a system identifier value and associating the system identifier value with the chain description data set;
    generating an archive including the configuration data sets, chain description data set, and system identifier value;
    extracting from the archive the configuration data sets, chain description data set, and system identifier value in response to a user control;
    preventing configuration of a target system with the extracted configuration data sets in response to a target system identifier value not matching the system identifier value extracted from the archive; and
    in response to the target system identifier value matching the system identifier value read from the archive,
        generating a configuration bitstream from the extracted configuration data sets identified by, and in the order specified in, the chain description data set; and
        configuring the target system with the configuration bitstream.

2. The method of claim 1, wherein the configurable devices comprise a programmable logic device.

3. The method of claim 1, further comprising compressing data in the archive.

4. A method for managing configuration data for a system, comprising:
    generating a chain description data set that specifies an order in a configuration chain of configurable devices in the system and identifies configuration data sets associated with the configurable devices;
    generating a system identifier value and associating the system identifier value with the chain description data set;
    generating an archive including the configuration data sets, chain description data set, and system identifier value;
    extracting from the archive the configuration data sets, chain description data set, and system identifier value in response to a user control;
    determining a target system identifier value of a target system;
    comparing the target system identifier value to the system identifier value extracted from the archive;
    if the target system identifier value does not match the system identifier value extracted from the archive, preventing configuration of the target system with the extracted configuration data sets; and
    if the target system identifier value matches the system identifier value read from the archive,
        generating a configuration bitstream from the extracted configuration data sets identified by, and in the order specified in, the chain description data set; and
        configuring the target system with the configuration bitstream.

5. The method of claim 4, wherein each configuration data set is stored in a respective data file, the method further comprising:
    creating a hierarchy of directories;
    storing each data file in one of the directories in the hierarchy;
    storing the hierarchy of directories and data files in the archive; and wherein the extracting step includes extracting the hierarchy of directories and data files from the archive and replicating the hierarchy of directories and data files in a user-selected storage location.

6. The method of claim 4, wherein the step of generating the system identifier value comprises:
reading values of identification codes from each of the configurable devices; and
generating the system identifier value as a function of the values of the identifications codes from the configurable devices.

7. The method of claim 6, wherein the step of reading comprises:
reading the value of a first register in each of the configurable devices, wherein the state of each first register is a non-programmable value.

8. The method of claim 7, wherein the step of reading further comprises:
reading the value of a second register in each of the configurable devices, wherein each second register is user-programmable.

9. The method of claim 6, wherein the step of reading comprises:
inputting a control code to each of the configurable devices
outputting the values of the identification codes serially from at least one of the configurable devices in response to the control code.

10. The method of claim 6, wherein the step of reading further comprises:
reading values from registers in the configurable devices, wherein each register is user-programmable.

11. The method of claim 10, further comprising:
storing in the register of the at least one configurable device a checksum value derived from configuration data used in configuring the at least one configurable device.

12. The method of claim 11, wherein the step of generating the system identifier value includes concatenating the values.

13. The method of claim 10, wherein the configurable devices are arranged and coupled in a scan chain, and the function used in generating the system identifier value is further a function of respective positions of the configurable devices in the scan chain.

14. The method of claim 6, wherein the step of generating the system identifier value includes concatenating the values.

15. The method of claim 6, wherein the configurable devices are arranged and coupled in a scan chain, and the function used in generating the system identifier value is further a function of respective positions of the configurable devices in the scan chain.

16. The method of claim 6, wherein the step of reading comprises:
inputting a control code to at least one of the configurable devices;
outputting the values of the identification codes serially from a boundary-scan register in at least one of the configurable devices in response to the control code.

17. The method of claim 16, wherein the control code is a boundary-scan SAMPLE instruction.

18. The method of claim 16, wherein the control code is a boundary-scan EXTEST instruction.

19. The method of claim 16, wherein the boundary-scan register is one of an IDCODE register and a USERCODE register.

20. The method of claim 6, wherein the value of an identification code from a configurable device is configuration data read back from the configurable device.

21. The method of claim 20, wherein the step of generating the system identifier value comprises:
generating checksum values from the configuration data; and
generating the system identifier as a function of the checksum values.

22. The method of claim 6, wherein the system includes a plurality of non-volatile memories coupled to the configurable devices, the configurable devices are boundary-scan accessible, and the reading step includes reading the values of the identification codes from the plurality of non-volatile memories.

23. An arrangement for managing configuration data for a system, comprising:
a software tool hosted on a data processing arrangement;
a system interface coupled to the tool and to the system; and
wherein the tool is configured to,
generate a chain description data set that specifies an order in a configuration chain of configurable devices in the system and identifies configuration data sets associated with the configurable devices;
generate a system identifier value and associating the system identifier value with the chain description data set;
generate an archive including the configuration data sets, chain description data set, and system identifier value;
extract, in response to a user-input control, from the archive the configuration data sets, chain description data set, and system identifier value in response to a user control;
determine a target system identifier value of a target system;
compare the target system identifier value to the system identifier value extracted from the archive;
if the target system identifier value does not match the system identifier value extracted from the archive, prevent configuration of the target system with the extracted configuration data sets; and
if the target system identifier value matches the system identifier value read from the archive,
generate a configuration bitstream from the extracted configuration data sets identified by, and in the order specified in, the chain description data set; and
configure the target system with the configuration bitstream.

* * * * *